United States Patent
Chung et al.

(10) Patent No.: US 10,297,197 B2
(45) Date of Patent: May 21, 2019

(54) ORGANIC LIGHT EMITTING DIODE DISPLAY DEVICE WITH SHARED TRANSISTORS AMONG PIXELS

(71) Applicant: LG Display Co., Ltd., Seoul (KR)

(72) Inventors: Eui-Hyun Chung, Goyang-si (KR); Sung-Hun Kim, Iksan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/672,952

(22) Filed: Aug. 9, 2017

(65) Prior Publication Data
US 2018/0151118 A1    May 31, 2018

(30) Foreign Application Priority Data

Nov. 30, 2016 (KR) .................... 10-2016-0162344

(51) Int. Cl.
G09G 3/32 (2016.01)
G09G 3/3233 (2016.01)
G09G 3/3275 (2016.01)
H01L 27/32 (2006.01)

(52) U.S. Cl.
CPC ......... *G09G 3/3233* (2013.01); *G09G 3/3275* (2013.01); *H01L 27/3262* (2013.01); *G09G 2300/043* (2013.01); *G09G 2300/0426* (2013.01); *G09G 2300/0465* (2013.01); *G09G 2300/0814* (2013.01); *G09G 2300/0819* (2013.01); *G09G 2310/0251* (2013.01); *G09G 2310/0264* (2013.01); *G09G 2320/045* (2013.01)

(58) Field of Classification Search
CPC . G09G 3/3233; G09G 3/3275; H01L 27/3262
USPC .......................................................... 345/82
See application file for complete search history.

(56) References Cited

U.S. PATENT DOCUMENTS

| | | | |
|---|---|---|---|
| 2011/0157125 A1* | 6/2011 | Choi | H05B 33/0896 345/211 |
| 2012/0001896 A1* | 1/2012 | Han | G09G 3/3233 345/214 |
| 2015/0008395 A1* | 1/2015 | Yoon | H01L 27/1237 257/40 |
| 2015/0379930 A1 | 12/2015 | Lee et al. | |
| 2016/0141352 A1* | 5/2016 | Sung | G09G 3/3233 257/40 |
| 2017/0148384 A1* | 5/2017 | Lee | G09G 3/3233 |

OTHER PUBLICATIONS

Extended European Search Report for European Patent Application No. EP 17195686.5, dated Jan. 4, 2018, 10 Pages.

* cited by examiner

*Primary Examiner* — Jonathan M Blancha
(74) *Attorney, Agent, or Firm* — Fenwick & West LLP

(57) ABSTRACT

An organic light emitting diode (OLED) display device for simplifying a structure of an internal compensation pixel circuit is disclosed. The OLED display device is configured in such a way that an $N^{th}$ pixel circuit shares a transistor for initializing a storage capacitor and a gate electrode of a driving transistor that belong to an $(N+1)^{th}$ pixel circuit to initialize an OLED element. Accordingly, a transistor for initializing an OLED element is omitted from each pixel circuit, thereby simplifying a circuit structure and reducing a circuit area.

7 Claims, 9 Drawing Sheets

ORGANIC LIGHT EMITTING DIODE DISPLAY DEVICE WITH SHARED TRANSISTORS AMONG PIXELS

CROSS-REFERENCE TO RELATED APPLICATIONS

This application claims the benefit of Republic of Korea Patent Application No. 10-2016-0162344, filed on Nov. 30, 2016, which is hereby incorporated by reference in its entirety.

BACKGROUND

Field of Technology

The present disclosure relates to an organic emitting diode display device for simplifying a structure of an internal compensation pixel circuit.

Discussion of the Related Art

Recently, a liquid crystal display (LCD) using liquid crystal, an organic light emitting diode (OLED) display device using an OLED, an electrophoretic display (EPD) using electrophoretic particles, etc. have been representatively used as a flat display device for displaying an image by using digital data.

There among, an OLED display device is a self-emitting device configured in such a way that an organic light emitting layer emits light via recombination between electrons and holes and is expected as a next-generation display device in terms of high brightness, low driving voltage, and an ultra thin film.

Each of a plurality of pixels included in an OLED display device includes an OLED element and a pixel circuit for independently driving the OLED element. The pixel circuit adjusts current Ids for driving the OLED element by a driving transistor by a driving voltage Vgs corresponding to a data signal to adjust brightness of the OLED element.

With regard to an OLED display device, characteristics such as a threshold voltage value (hereinafter, Vth) of a driving transistor are irregular for each respective pixel and, thus, current Ids with respect to the same driving voltage Vgs is changed, thereby causing brightness deviation.

To overcome this, an internal compensation technology of an OLED display device for compensating for Vth of a driving transistor in each pixel circuit and driving the driving transistor using a data signal, Vth of which is compensated for, has been proposed.

However, a pixel circuit having an internal compensation function includes a plurality of transistors and, thus, a pixel circuit disadvantageously has a complex structure. For example, a high resolution model of quad high definition (QHD) or more has been known as using an internal compensation pixel circuit of a 7T1C structure including seven transistors and one capacitor.

Accordingly, a conventional internal compensation pixel circuit has a limit in reducing an area occupied by a pixel circuit due to a plurality of transistor structures. Accordingly, it is difficult to enhance pixels per inch (ppi) along with increase in resolution and, thus, it is difficult to apply a high-resolution display device.

SUMMARY

Accordingly, the present disclosure is directed to an organic light emitting diode display device that substantially obviates one or more problems due to limitations and disadvantages of the related art.

An object of the present disclosure is to provide an organic light emitting diode display device for simplifying a structure of an internal compensation pixel circuit.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, an organic light emitting diode (OLED) display device is configured in such a way that an $N^{th}$ pixel circuit shares a transistor for initializing a storage capacitor and a gate electrode of a driving transistor that belong to an $(N+1)^{th}$ pixel circuit to initialize an light emitting element. Accordingly, a transistor for initializing a light emitting element may be omitted from each pixel circuit, thereby simplifying a circuit structure and reducing a circuit area.

In an aspect of the present disclosure, an organic light emitting diode (OLED) display device includes a plurality of pixel circuits, each of the plurality of pixel circuits including a light emitting element, a driving transistor configured to drive the light emitting element depending on a driving voltage, a first transistor configured to connect a first electrode and a gate electrode of the driving transistor in response to a scan signal of an $N^{th}$ (N is a natural number) scan line, a second transistor configured to supply a data voltage of a data line to a second electrode of the driving transistor in response to a scan signal of the $N^{th}$ scan line, a third transistor configured to supply a first supply voltage of a power line to the second electrode of the driving transistor in response to a light emitting control signal of an $N^{th}$ light emitting control line, a fourth transistor configured to connect the driving transistor to the light emitting element in response to a light emitting control signal of the $N^{th}$ light emitting control line, a fifth transistor configured to initialize a first node to which a gate electrode of the driving transistor and a storage capacitor are connected, to an initialization voltage of an initialization voltage supplying line, in response to a scan signal of an $(N-1)^{th}$ scan line, and the storage capacitor connected between the power line and the first node and configured to store a driving voltage of the driving transistor.

An light emitting element of an $N^{th}$ pixel circuit connected to the $N^{th}$ scan line and the $(N-1)^{th}$ scan line among the plurality of pixel circuits may be connected to a fifth transistor of an $(N+1)^{th}$ pixel circuit connected to the $N^{th}$ scan line and the next $(N+1)^{th}$ scan line through a connection electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the invention and together with the description serve to explain the principle of the invention. In the drawings.

DETAILED DESCRIPTION

Figure 1:
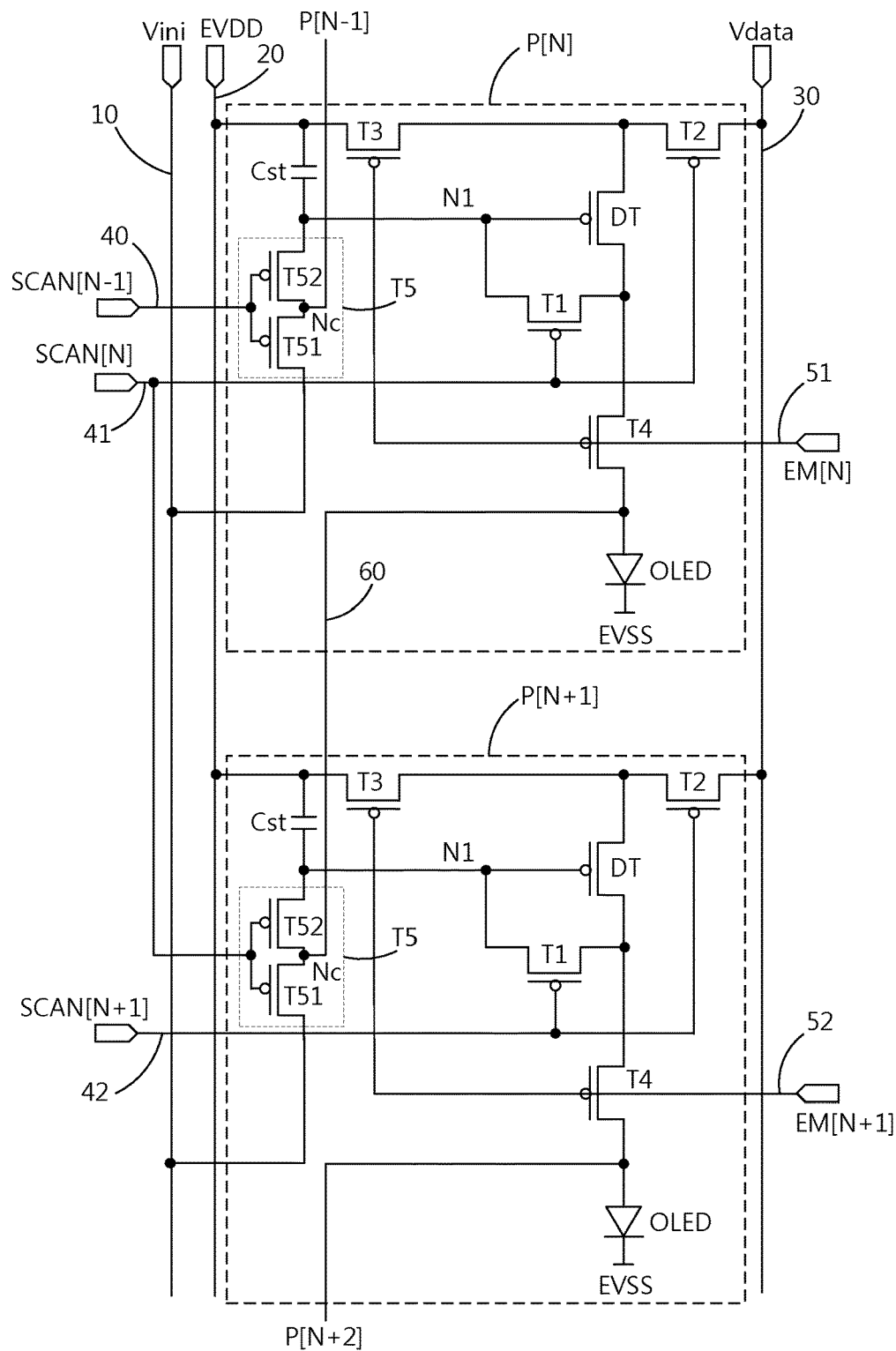
FIG. 1 is an equivalent circuit diagram illustrating a pixel circuit structure of an organic light emitting diode (OLED) display device according to an embodiment of the present disclosure.

FIG. 1 is an equivalent circuit diagram illustrating a pixel circuit structure of an organic light emitting diode (OLED) display device according to an embodiment of the present invention.

Referring to FIG. 1, the OLED display device may include an $N^{th}$ pixel circuit P[N] and an $(N+1)^{th}$ pixel circuit P[N+1] that are sequentially scanned and share some transistor T5.

The pixel circuits P[N] and P[N+1] may be connected to an initialization voltage supplying line 10 for supplying an initialization voltage Vini, a first power line 20 for supplying a high voltage supply voltage EVDD, and a data line 30 for supplying a data voltage Vdata. The $N^{th}$ pixel circuit P[N] may be connected to an $(N-1)^{th}$ scan line 40, an $N^{th}$ scan line 41, and an $N^{th}$ light emitting control line 51 and the $(N+1)^{th}$ pixel circuit P[N+1] may be connected to the $N^{th}$ scan line 41, an $(N+1)^{th}$ scan line 42, and an $(N+1)^{th}$ light emitting control line 52.

Each of the pixel circuits P[N] and P[N+1] may include first to fifth transistors T1 to T5, a driving transistor DT, and a storage capacitor Cst and may independently drive an OLED element. All the transistors T1 to T5 and DT of the pixel circuits P[N] and P[N+1] may be implemented with a P-channel or N-channel type thin film transistor TFT. According to the following embodiments, an example in which all the transistors DT and T1 to T5 are implemented with only a P-channel type TFT will be described but an N-channel type TFT may also be applied.

The $N^{th}$ and $(N+1)^{th}$ pixel circuits P[N] and P[N+1] may have the same circuit structure except that only control lines for controlling respective transistors, that is, a scan line and a light emitting control line are sequentially changed. Hereinafter, a detailed structure and driving procedure of a pixel circuit will be described with reference to the $N^{th}$ pixel circuit P[N].

An OLED element of the $N^{th}$ pixel circuit P[N] may include an anode connected to the driving TFT DT, a cathode connected to a low voltage supply voltage EVSS, and a light emitting layer between the anode and the cathode and generate light, the amount of which is proportional to the amount of current supplied from the driving TFT DT.

A first electrode of the storage capacitor Cst of the $N^{th}$ pixel circuit P[N] may be connected to the first power line 20 and a second electrode may be connected to a first node N1 connected to a gate electrode of the driving transistor DT so as to be charged with a driving voltage Vgs of the driving transistor DT.

The driving transistor DT of the $N^{th}$ pixel circuit P[N] may control current for driving an OLED element by the driving voltage Vgs stored in the storage capacitor Cst.

A first transistor T1 of the $N^{th}$ pixel circuit P[N] may be controlled by a scan signal SCAN[N] of the $N^{th}$ scan line 41 and a gate electrode and a drain electrode of the driving transistor DT may be connected to connect the driving transistor DT to a diode structure during a sampling period of the $N^{th}$ pixel circuit P[N].

A second transistor T2 of the $N^{th}$ pixel circuit P[N] may be controlled by the scan signal SCAN[N] of the $N^{th}$ scan line 41 and may supply the data voltage Vdata of the data line 30 to a source electrode of the driving transistor DT during a sampling period of the $N^{th}$ pixel circuit P[N].

A third transistor T3 of the $N^{th}$ pixel circuit P[N] may be controlled by a light emitting control signal EM[N] of the $N^{th}$ light emitting control line 51 and may supply a high voltage supply voltage EVDD of a first power line 20 to a source electrode of the driving transistor DT during a light emitting period of the $N^{th}$ pixel circuit P[N].

A fourth transistor T4 of the $N^{th}$ pixel circuit P[N] may be controlled by the light emitting control signal EM[N] of the $N^{th}$ light emitting control line 51 and may supply driving current supplied from the driving transistor DT to the OLED element during a light emitting period of the $N^{th}$ pixel circuit P[N].

A fifth transistor T5 of the $N^{th}$ pixel circuit P[N] may be controlled by a scan signal SCAN[N−1] of the $(N−1)^{th}$ scan line 40 and may initialize the first node N1 connected to the storage capacitor Cst and a gate electrode of the driving transistor DT to an initialization voltage Vini during an initialization period of the $N^{th}$ pixel circuit P[N].

The fifth transistor T5 may be configured as a dual gate transistor in that a fifth transistor pair T51 and T52 which share a gate and are connected in series forms a direct current path according to control of connected dual gates, as shown in FIG. 1. The dual gate structure of fifth transistor T5 may suppress unstable current and may stably initialize the first node N1.

In particular, an OLED element of the $N^{th}$ pixel circuit P[N] may be connected to the fifth transistor T5 of the $(N+1)^{th}$ pixel circuit P[N+1] through a connection electrode 60 and initialized by the fifth transistor T5 of the $(N+1)^{th}$ pixel circuit P[N+1]. Accordingly, during a sampling period of the $N^{th}$ pixel circuit P[N] that overlaps an initialization period of the $(N+1)^{th}$ pixel circuit P[N+1], an anode of the OLED element of the $N^{th}$ pixel circuit P[N] may be initialized by the initialization voltage Vini through the connection electrode 60 and the fifth transistor T5 of the $(N+1)^{th}$ pixel circuit P[N+1].

For example, in the fifth transistor pair T51 and T52 of a dual gate that belongs to the $(N+1)^{th}$ pixel circuit P[N+1], a connection node Nc between T51 and T52 may be connected to an anode of the OLED element of the $N^{th}$ pixel circuit P[N] through the connection electrode 60.

Based on the same principle, the dual gate structure of fifth transistor T5 that belongs to the $N^{th}$ pixel circuit P[N] may be connected to an anode of an OLED element of an $(N−1)^{th}$ pixel circuit P[N−1] through the connection node Nc and the connection electrode 60 to initialize the first node N1 of the $N^{th}$ pixel circuit P[N] by an initialization voltage Vini and to also initialize an anode of the OLED element of the $(N-1)^{th}$ pixel circuit P[N-1] by the initialization voltage Vini.

As such, according to an embodiment of the present disclosure, the $N^{th}$ pixel circuit P[N] may share the transistor T5 for initializing a storage capacitor Cst and a gate electrode of the driving transistor DT that belongs to the $(N+1)^{th}$ pixel circuit P[N+1] to initialize an OLED element. Accordingly, each pixel circuit does not require an additional transistor for initializing an OLED element, thereby simplifying a circuit structure and reducing a circuit area.

Figure 2:
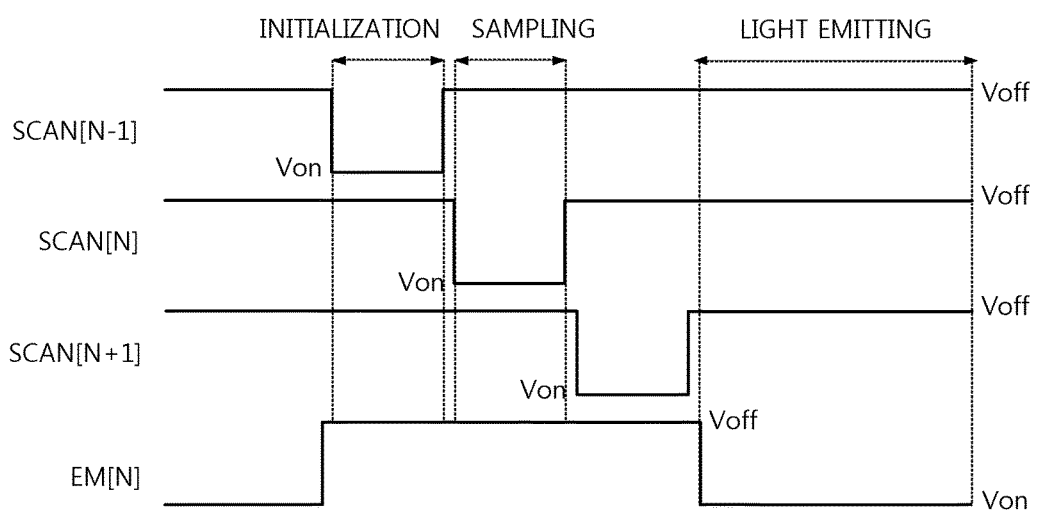
FIG. 2 is a driving waveform diagram of a pixel circuit according to an embodiment of the present disclosure.
Figure 3A:
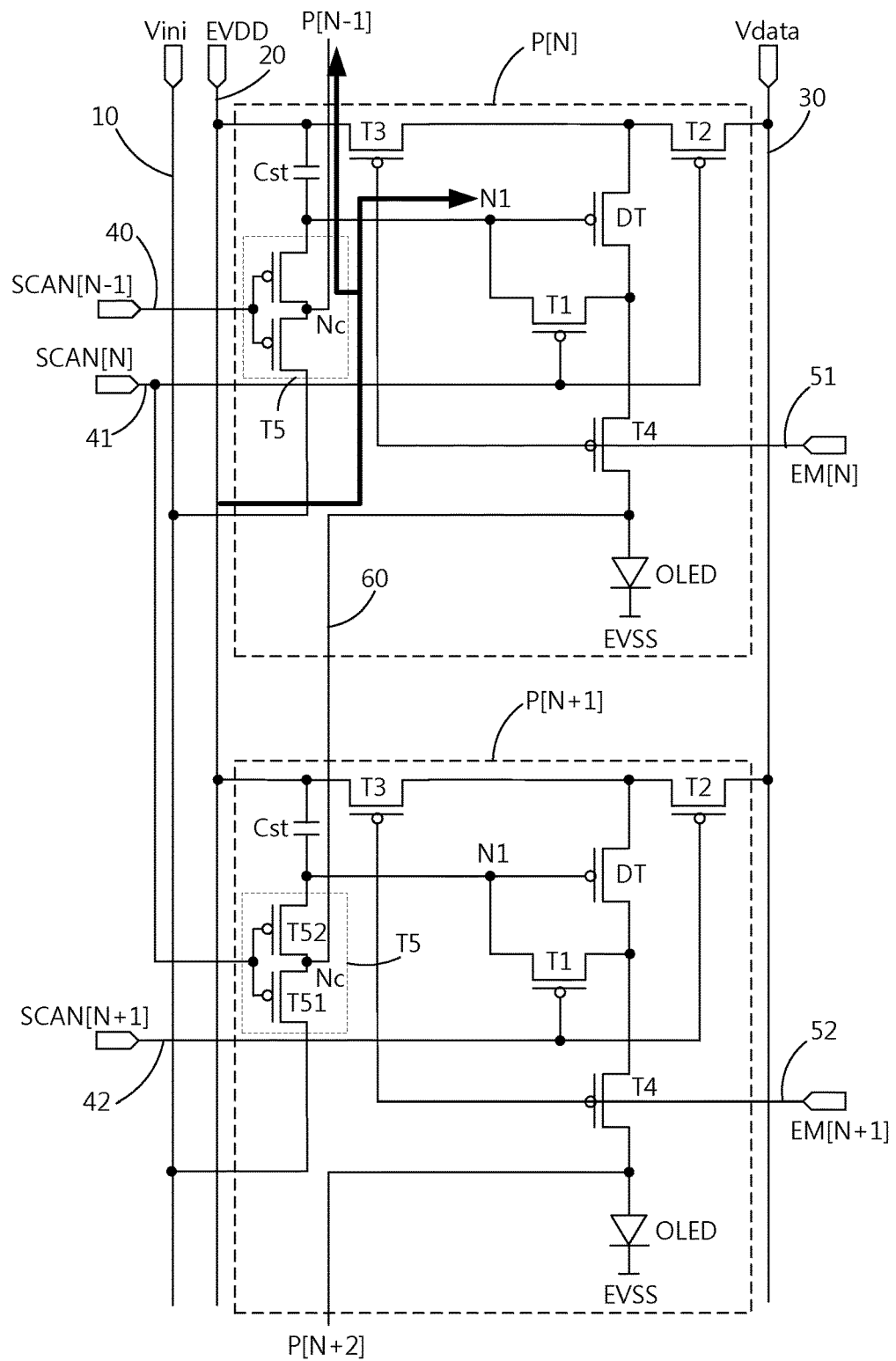
FIGS. 3A to 3C are diagrams sequentially illustrating a driving procedure of a pixel circuit according to an embodiment of the present disclosure.
Figure 3B:
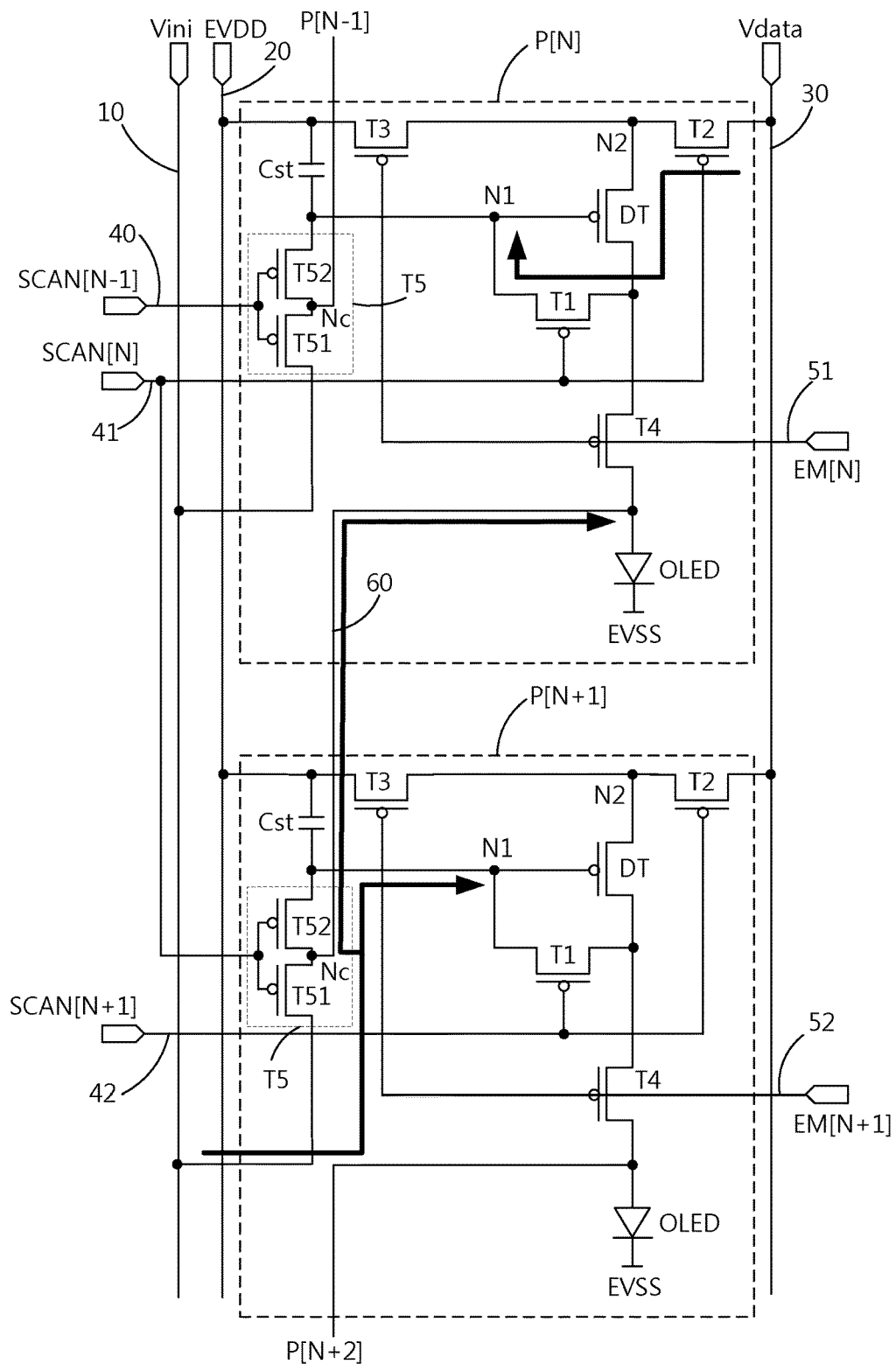
Figure 3C:
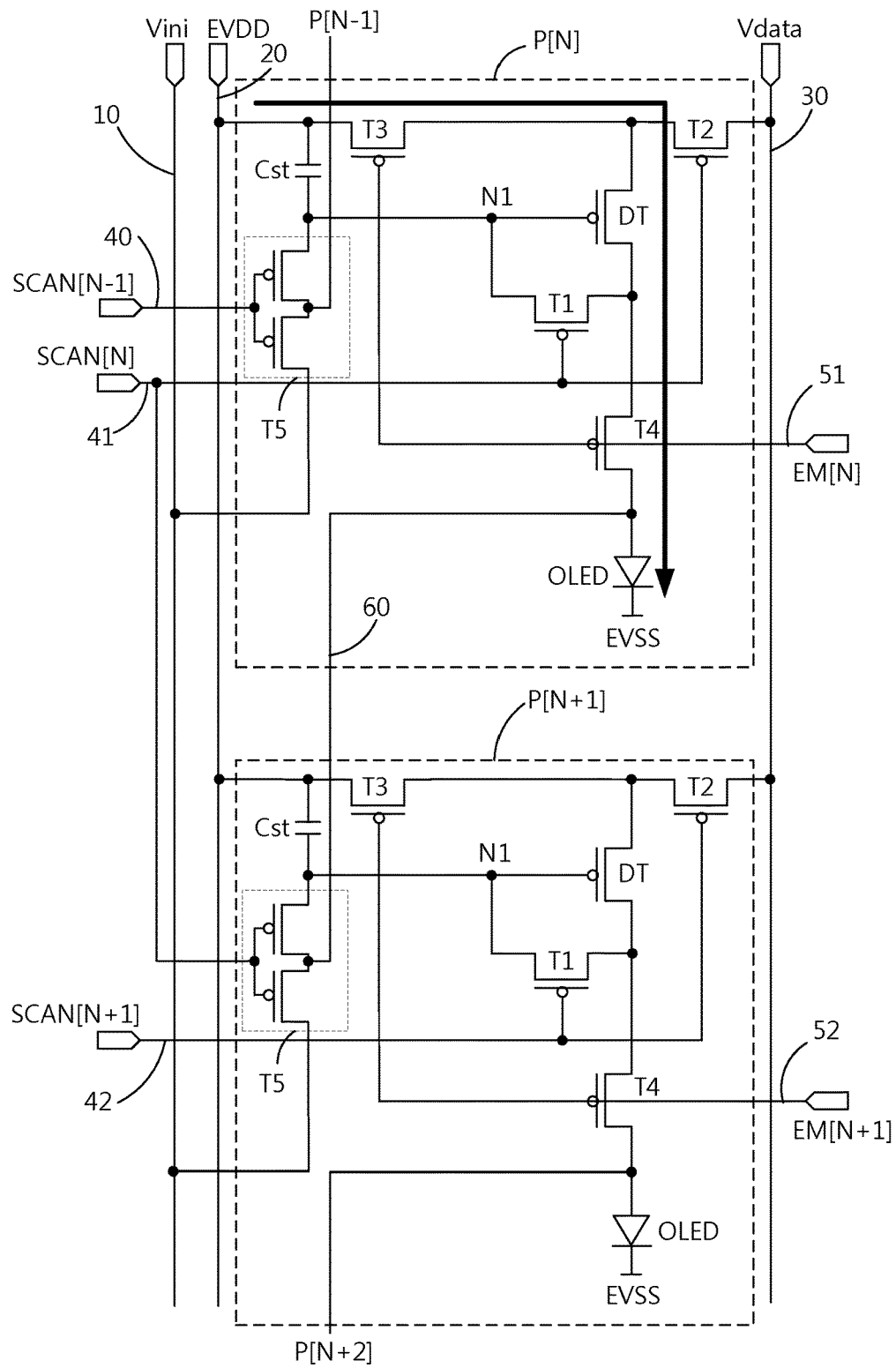

FIG. 2 is a driving waveform diagram of a pixel circuit according to an embodiment of the present disclosure. FIGS. 3A to 3C are diagrams sequentially illustrating a driving procedure of a pixel circuit according to an embodiment of the present disclosure.

Referring to FIG. 2, the scan signal SCAN[N-1] of the $(N-1)^{th}$ scan line 40, the scan signal SCAN[N] of the $N^{th}$ scan line 41, and the scan signal SCAN[N+1] of the $(N+1)^{th}$ scan line 42 may supply a scan pulse of a gate on voltage Von during respective scan periods of corresponding scan lines that are sequentially shifted and supply a gate off voltage Voff during the remaining period. The light emitting control signal EM[N] of the $N^{th}$ light emitting control line 51 may supply the gate off voltage Voff during a non-emitting period that overlaps scan periods of the $(N-1)^{th}$, $N^{th}$, and $(N+1)^{th}$ scan lines 40, 41, and 42 and supply the gate on voltage Von during the remaining emitting period.

To control the P-channel type transistors T1 to T5 shown in FIG. 1, in FIG. 2, the gate on voltage Von may be supplied at a low level and the gate off voltage Voff may be supplied at a high level. When the transistors T1 to T5 shown in FIG. 1 are configured as an N-channel type transistor, the gate on voltage Von may be supplied at a high level and the gate off voltage Voff may be supplied at a low level, oppositely to FIG. 2.

Referring to FIGS. 2 and 3A, during an initialization period of the $N^{th}$ pixel circuit P[N], the fifth transistor T5 may be turned on in response to the scan signal SCAN[N-1] of the $(N-1)^{th}$ scan line 40 to initialize the first node N1 of the $N^{th}$ pixel circuit P[N] to an initialization voltage Vini and to also initialize an anode of an OLED element of the $(N-1)^{th}$ pixel circuit P[N-1] to an initialization voltage Vini. During the initialization period, the first to fourth transistors T1 to T4 of the $N^{th}$ pixel circuit P[N] and the driving transistor DT may be turned off.

Referring to FIGS. 2 and 3B, during a sampling period of the $N^{th}$ pixel circuit P[N], the first and second transistors T1 and T3 may be turned on in response to the scan signal SCAN[N] of the $N^{th}$ scan line 41. During the sampling period, the second transistor T2 may supply the data voltage Vdata of the data line 30 to a source element of the driving transistor DT and the first transistor T1 may connect a gate electrode and a drain electrode of the driving transistor DT such that the driving transistor DT operates as a diode structure. Since Vth is compensated for by an operation of a diode of the driving transistor DT, a data voltage "Vdata-Vth" obtained by compensating for Vth may be supplied to the gate electrode of the driving transistor DT. Accordingly, the storage capacitor Cst may be charged by a driving voltage "Vgs=EVDD-Vdata+Vth" to which the data voltage "Vdata-Vth" obtained by compensating for Vth is applied and may supply the driving voltage "Vgs=EVDD-Vdata+Vth" to the driving transistor DT during a next light emitting period. During the sampling period, the third to fifth transistors T3 to T5 may be turned-off.

In particular, during a sampling period of the $N^{th}$ pixel circuit P[N], the fifth transistor T5 of the $(N+1)^{th}$ pixel circuit P[N+1] may be turned on in response to the scan signal SCAN[N] of the $N^{th}$ scan line 41 and, while the first node N1 of the $(N+1)^{th}$ pixel circuit P[N+1] is initialized by an initialization voltage Vini, an anode of an OLED element of the $N^{th}$ pixel circuit P[N] may also be initialized by the initialization voltage Vini through the connection electrode 60.

Referring to FIGS. 2 and 3C, during a light emitting period of the $N^{th}$ pixel circuit P[N], the third and fourth transistors T3 and T4 may be turned on in response to the light emitting control signal EM[N] of the $N^{th}$ light emitting control line 51. During the light emitting period, the third transistor T3 may supply the high voltage supply voltage EVDD of the first power line 20 to a source electrode of the driving transistor DT and the fourth transistor T4 may supply driving current supplied from the driving transistor DT to an OLED element such that an OLED element emits light. In this case, the driving transistor DT may supply driving current Ioled to an OLED element using the driving voltage Vgs=EVDD-Vdata+Vth stored in the storage capacitor Cst. The driving current Ioled of the OLED element may be determined according to "EVDD-Vdata" by offsetting a component Vth of the driving transistor DT according to Equation 1 below. In Equation 1 below, k is a proportional coefficient including mobility of the driving transistor DT and a component of channel width W/length L.

$$\text{Ioled} = k(Vgs-Vth)^2 = k\{\text{EVDD}-V\text{data}+Vth)-Vth\}^2 = k(\text{EVDD}-V\text{data})^2 \qquad \text{[Equation 1]}$$

As such, according to an embodiment of the present disclosure, since the $N^{th}$ pixel circuit P[N] and the $(N+1)^{th}$ pixel circuit P[N+1] may share the fifth transistor T5, an additional transistor for initializing an OLED element is not required and, thus, each pixel circuit may be simplified as a 6T1C structure including six transistors and one capacitor.

Figure 4:
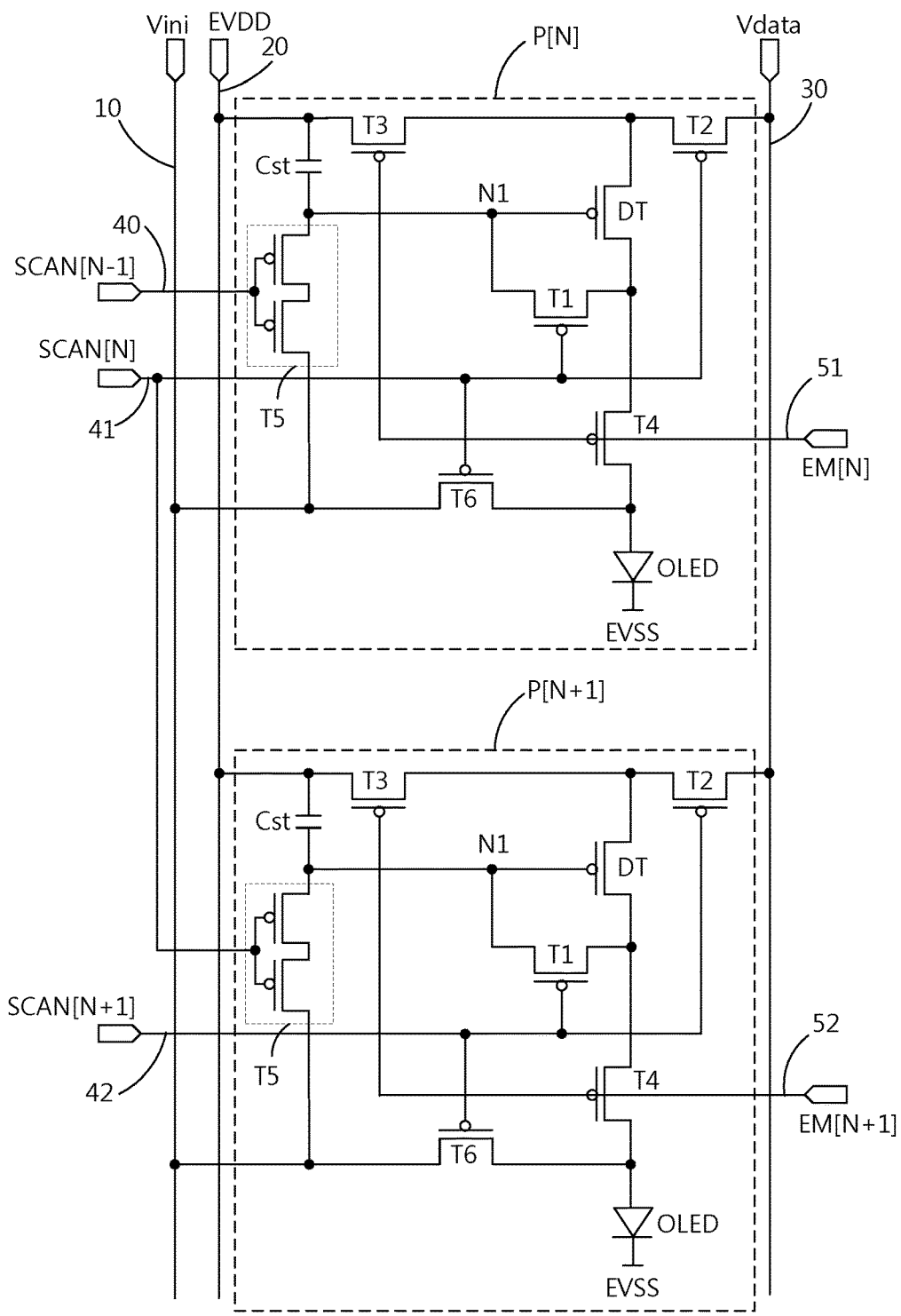
FIG. 4 is a diagram illustrating a pixel circuit according to the related art compared with the embodiment of the present disclosure shown in FIG. 1.

FIG. 4 is a diagram illustrating a pixel circuit according to the related art compared with the embodiment of the present disclosure shown in FIG. 1.

As seen from FIG. 4, each of the $N^{th}$ pixel circuit P[N] and the $(N+1)^{th}$ pixel circuit P[N+1] according to the related art includes a sixth transistor T6 for initializing an anode of an OLED element and, thus, has a 7T1C structure including seven transistors and one transistor.

The sixth transistor T6 of the $N^{th}$ pixel circuit P[N] may be turned on in response to the scan signal SCAN[N] of the $N^{th}$ scan line 41 that controls the first and second transistors T1 and T2 during a sampling period of the $N^{th}$ pixel circuit P[N] to initialize an anode of an OLED element of the $N^{th}$ pixel circuit P[N] to the initialization voltage Vini.

The sixth transistor T6 of the $(N+1)^{th}$ pixel circuit P[N+1] may be turned on in response to the scan signal SCAN[N+1] of the $(N+1)^{th}$ scan line 42 during a sampling period of the $(N+1)^{th}$ pixel circuit P[N+1] to initialize an anode of an OLED element of the $(N+1)^{th}$ pixel circuit P[N+1] to the initialization voltage Vini.

As such, compared with the prior art in that each pixel circuit includes the sixth transistor T6 that initializes an OLED element, according to an embodiment of the present disclosure shown in FIG. 1, since the sixth transistor T6 may be omitted, a pixel circuit structure may be simplified and an area of a pixel circuit may be reduced and, thus, the embodiment of the present invention may be advantageously applied to a high resolution display device.

Figure 5:
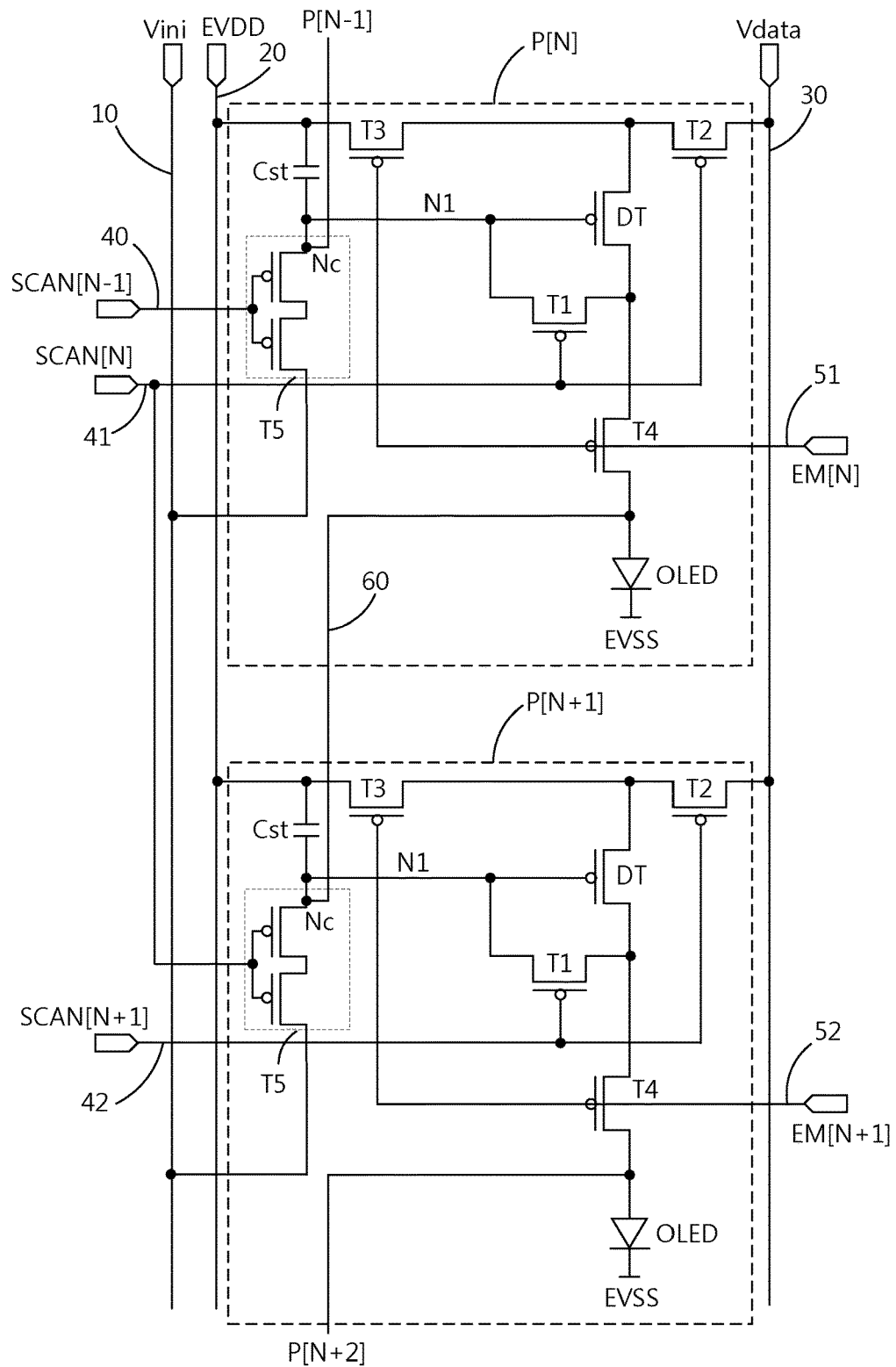
FIG. 5 is an equivalent circuit diagram showing a pixel circuit structure of an OLED display device according to an embodiment of the present disclosure.
Figure 6:
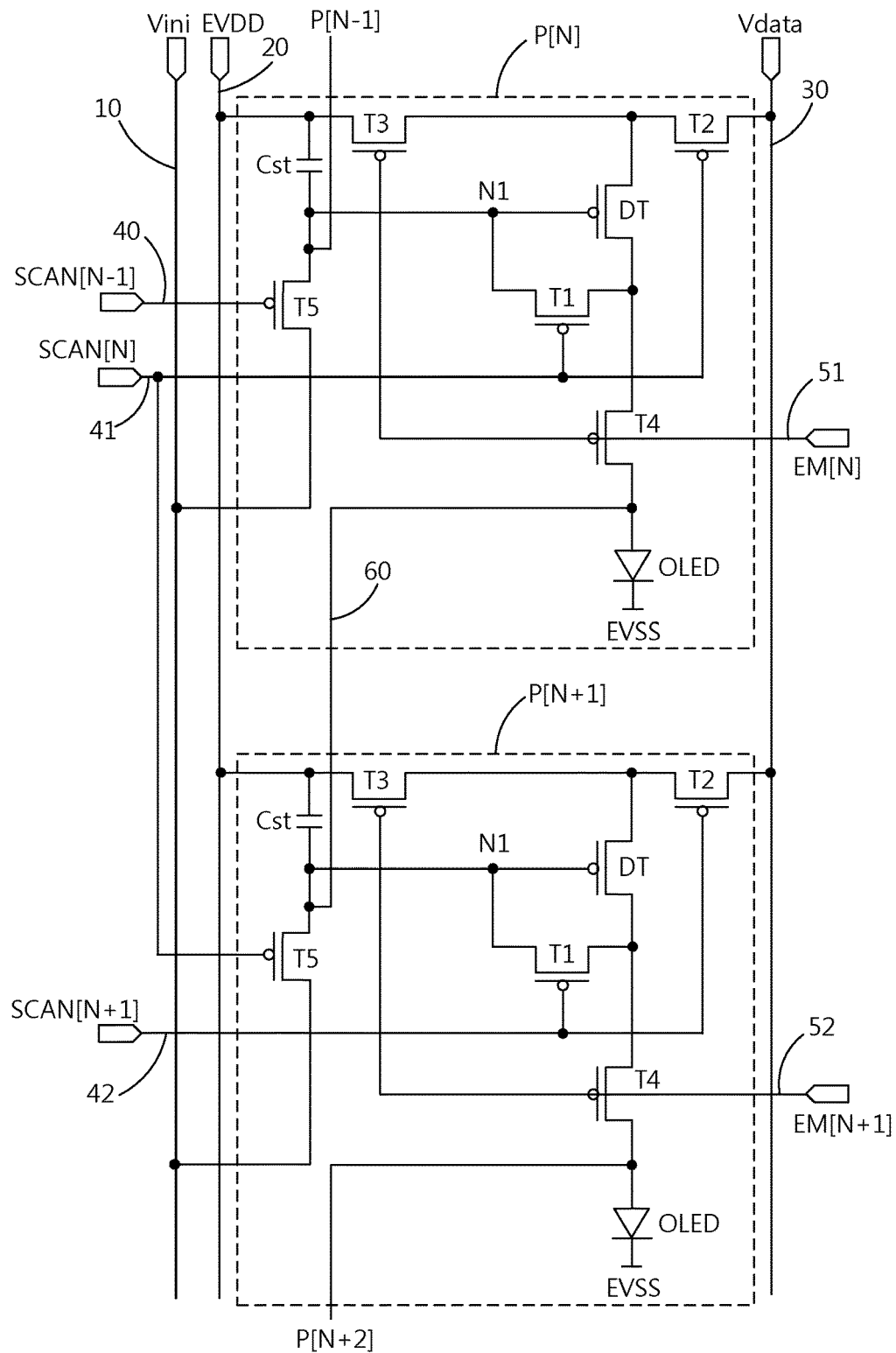
FIG. 6 is an equivalent circuit diagram showing a pixel circuit structure of an OLED display device according to an embodiment of the present disclosure.
Figure 7:
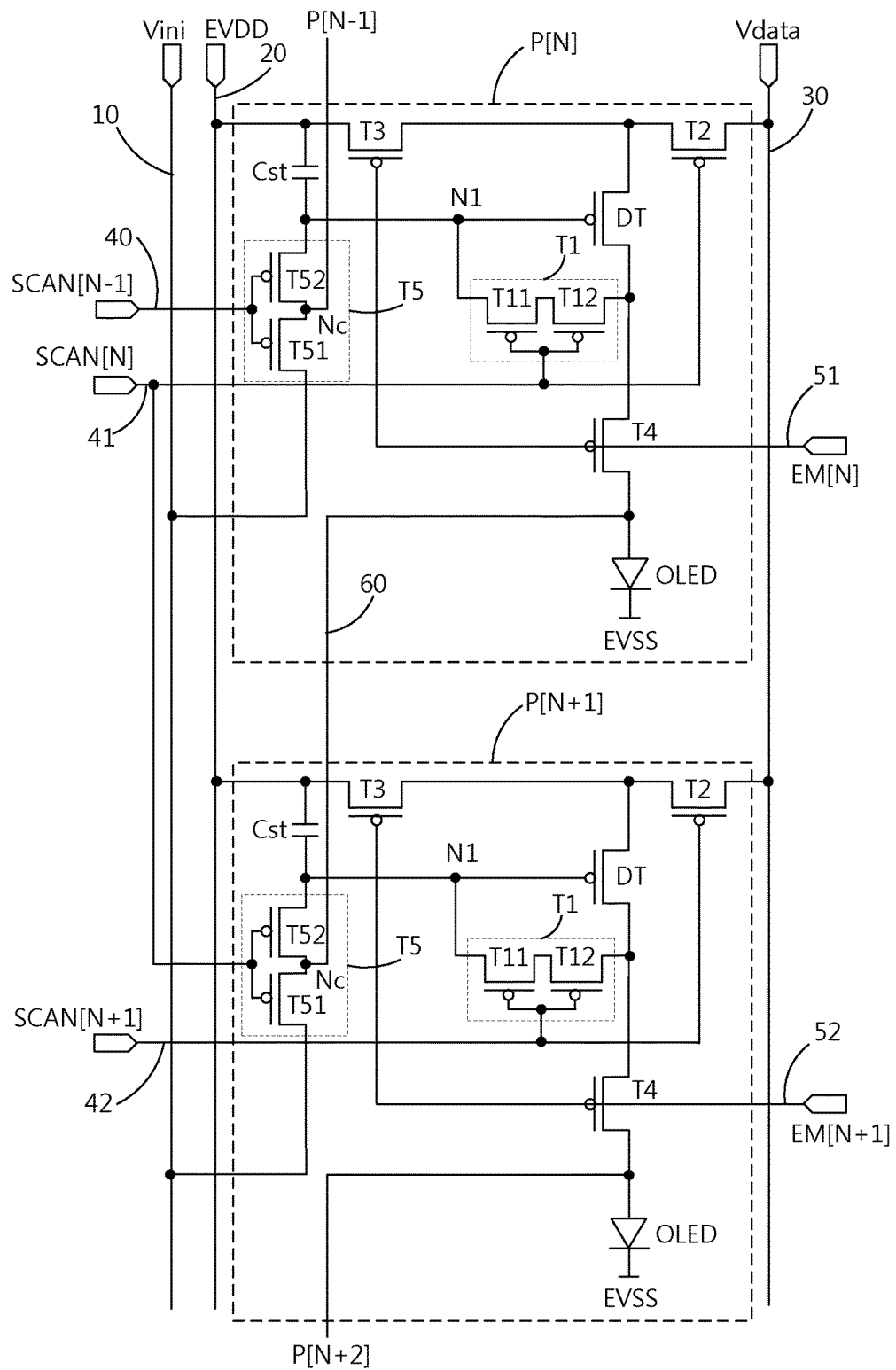
FIG. 7 is an equivalent circuit diagram showing a pixel circuit structure of an OLED display device according to an embodiment of the present disclosure.

FIGS. 5 to 7 are equivalent circuit diagrams showing a pixel circuit structure of an OLED display device according to respective embodiments of the present disclosure.

Referring to FIG. 5, the connection electrode 60 connected to an anode of an OLED of the $N^{th}$ pixel circuit P[N] may be connected to the connection node Nc between the dual gate fifth transistor T5 of the $(N+1)^{th}$ pixel circuit P[N+1] and the first node N1.

Referring to FIG. 6, the fifth transistor T5 may use a single gate transistor structure and, in this case, the connection electrode 60 connected to an anode of an OLED element of the $N^{th}$ pixel circuit P[N] may be connected to the connection node Nc between the fifth transistor T5 of the $(N+1)^{th}$ pixel circuit P[N+1] and the first node N1.

Referring to FIG. 7, the first transistor T1 may also be configured as a dual gate structure of first transistor pair T11 and T12, thereby enhancing the device reliability of the first transistor T1.

As described above, according to an embodiment of the present disclosure, a pixel circuit of an OLED display device may share some transistors T5 with an adjacent pixel circuit, thereby simplifying an existing 7T1C structure as a 6T1C structure. Accordingly, an internal compensation pixel circuit according to an embodiment of the present disclosure may reduce an area of a pixel circuit due to the simplified circuit structure to enhance pixels per inch (ppi) and, thus, the embodiment of the present disclosure may be applied to a high resolution display device.

According to an embodiment of the present disclosure, a pixel circuit of an OLED display device may share some transistors with an adjacent pixel circuit, thereby simplifying an existing 7T1C structure as a 6T1C structure. Accordingly, an internal compensation pixel circuit according to an embodiment of the present disclosure may reduce an area of a pixel circuit due to the simplified circuit structure to enhance pixels per inch (ppi) and, thus, the embodiment of the present disclosure may be applied to a high resolution display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device comprising a plurality of N pixel circuits (N is a natural number) including an Nth pixel circuit and an $(N+1)^{th}$ pixel circuit that is in an adjacent row of pixel circuits to the Nth pixel circuit that each comprises:
   a light emitting element;
   a driving transistor configured to drive the light emitting element depending on a driving voltage;
   a first transistor configured to connect a first electrode and a gate electrode of the driving transistor in response to a scan signal of an $N^{th}$ (N is a natural number) scan line;
   a second transistor configured to supply a data voltage of a data line to a second electrode of the driving transistor in response to a scan signal of the $N^{th}$ scan line;
   a third transistor configured to supply a first supply voltage of a power line to the second electrode of the driving transistor in response to a light emitting control signal of an $N^{th}$ light emitting control line;
   a fourth transistor configured to connect the driving transistor to the light emitting element in response to a light emitting control signal of the $N^{th}$ light emitting control line;
   a fifth transistor configured to initialize a first node to which the gate electrode of the driving transistor and a storage capacitor are connected, to an initialization voltage of an initialization voltage supplying line, in response to a scan signal of an (N−1)th scan line, the fifth transistor comprising a first fifth transistor and a second fifth transistor that share a gate electrode and are connected in series; and
   the storage capacitor connected between the power line and the first node and configured to store a driving voltage of the driving transistor,
   wherein a light emitting element of the $N^{th}$ pixel circuit connected to the $N^{th}$ scan line and the $(N-1)^{th}$ scan line among the plurality of N pixel circuits is connected to a fifth transistor of the $(N+1)^{th}$ pixel circuit connected to the $N^{th}$ scan line and the next $(N+1)^{th}$ scan line through a connection electrode;
   wherein a first end of the connection electrode is connected to the anode of the light emitting element that belongs to the Nth pixel circuit, and a second end of the connection electrode is connected to a source electrode of the first fifth transistor of the (N+1)th pixel circuit;
   wherein during a sampling period of the $N^{th}$ pixel circuit and a sampling period of the $(N+1)^{th}$ pixel circuit, the second transistor of the $N^{th}$ pixel circuit supplies the data voltage of the $N^{th}$ pixel circuit to the driving transistor of the $N^{th}$ pixel circuit and the second transistor of the $(N+1)^{th}$ pixel circuit supplies the data voltage of the $(N+1)^{th}$ pixel circuit to the driving transistor of the $(N+1)^{th}$ pixel circuit, the first transistor of the $N^{th}$ pixel circuit connects the driving transistor of the $N^{th}$ pixel circuit to a diode structure of the $N^{th}$ pixel circuit and the first transistor of the $(N+1)^{th}$ pixel circuit connects the driving transistor of the $(N+1)^{th}$ pixel circuit to a diode structure of the $(N+1)^{th}$ pixel circuit, the storage capacitor of the $N^{th}$ pixel circuit stores a driving voltage of the $N^{th}$ pixel in which a threshold voltage is compensated for and to which the data voltage is applied, and the storage capacitor of the $(N+1)^{th}$ pixel circuit stores a driving voltage of the $(N+1)^{th}$ pixel in which a threshold voltage is compensated for and to which the data voltage is applied;
   wherein during a light emitting period of the $N^{th}$ pixel circuit that is subsequent the sampling period of the $N^{th}$ pixel circuit and a light emitting period off the $(N+1)^{th}$ pixel circuit that is subsequent the sampling period of the $(N+1)^{th}$ pixel circuit, the third transistor of the $N^{th}$ pixel circuit supplies the first supply voltage to the second node of the $N^{th}$ pixel circuit and the fourth transistor of the $N^{th}$ pixel circuit connects the driving transistor and the light emitting element of the $N^{th}$ pixel circuit, and the third transistor of the $(N+1)^{th}$ pixel circuit supplies the first supply voltage to the second node of the $(N+1)^{th}$ pixel circuit and the fourth transistor of the $(N+1)^{th}$ pixel circuit connects the driving transistor and the light emitting element of the $(N+1)^{th}$ pixel circuit;
   wherein the light emitting period of the $N^{th}$ pixel circuit is non-overlapping with the sampling period of the $N^{th}$ pixel circuit and the sampling period of the $(N+1)^{th}$ pixel circuit; and wherein the sampling period of the Nth pixel circuit and the sampling period of the (N+1)th pixel circuit are non-overlapping.

2. The OLED display device of claim 1, wherein the fifth transistor of the $(N+1)^{th}$ pixel circuit initializes a first node of the $(N+1)^{th}$ pixel circuit to the initialization voltage and initializes the light emitting element of the $N^{th}$ pixel circuit in response to the scan signal of the $N^{th}$ scan line.

3. The OLED display device of claim 1, wherein the connection electrode is connected to an anode of the light emitting element that belongs to the $N^{th}$ pixel circuit, and is connected to a connection node between the fifth transistor and a first node of the $(N+1)^{th}$ pixel circuit.

4. The OLED display device of claim 1, wherein the first transistor and the fifth transistor each comprises one pair of transistors that share a gate and are connected in series; and
wherein the connection electrode is connected to the anode of the light emitting element that belongs to the $N^{th}$ pixel circuit, and is connected to an intermediate node between the one pair of fifth transistors that belong to the $(N+1)^{th}$ pixel circuit or connected to a connection node between the fifth transistor and the first node that belongs to the $(N+1)^{th}$ pixel circuit.

5. The OLED display device of claim 1, wherein, in the $N^{th}$ pixel circuit,
during an initialization period, the fifth transistor initializes the first node to the initialization voltage, and
during the sampling period, the light emitting element is initialized to the initialization voltage by a fifth transistor that belongs to the $(N+1)^{th}$ pixel circuit.

6. The OLED display device of claim 1, wherein the (N+1)th pixel circuit is in an adjacent row of pixel circuits to the Nth pixel circuit.

7. The OLED display device of claim 6, wherein the sampling period of the Nth pixel circuit and the sampling period of the (N+1)th pixel circuit are non-overlapping.

* * * * *